US012812883B2

(12) United States Patent
Kim et al.

(10) Patent No.: US 12,812,883 B2
(45) Date of Patent: Nov. 24, 2026

(54) SEMICONDUCTOR DEVICE WITH CAPACITOR STRUCTURE

(71) Applicant: Samsung Electronics Co., Ltd., Suwon-si (KR)

(72) Inventors: Hyungjun Kim, Suwon-si (KR); Sangwuk Park, Suwon-si (KR); Hyunchul Yoon, Suwon-si (KR); Jungpyo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 365 days.

(21) Appl. No.: 18/423,647

(22) Filed: Jan. 26, 2024

(65) Prior Publication Data

US 2024/0321940 A1 Sep. 26, 2024

(30) Foreign Application Priority Data

Mar. 24, 2023 (KR) ........................ 10-2023-0039244
May 3, 2023 (KR) ........................ 10-2023-0057746

(51) Int. Cl.
*H10D 1/68* (2025.01)
*H10B 12/00* (2023.01)

(52) U.S. Cl.
CPC ........... *H10D 1/692* (2025.01); *H10B 12/033* (2023.02)

(58) Field of Classification Search
CPC ..... H10B 12/03; H10B 12/033; H10B 12/315
See application file for complete search history.

(56) References Cited

U.S. PATENT DOCUMENTS

| | | | |
|---|---|---|---|
| 5,366,917 | A | 11/1994 | Watanabe et al. |
| 6,794,704 | B2 | 9/2004 | Yates et al. |
| 7,595,526 | B2 | 9/2009 | Shin et al. |
| 7,688,570 | B2 | 3/2010 | Lee et al. |
| 2011/0095396 | A1 | 4/2011 | Fumitake |

(Continued)

FOREIGN PATENT DOCUMENTS

| | | | |
|---|---|---|---|
| KR | 10-2009-0032223 | A | 4/2009 |
| KR | 10-2009-0088549 | A | 8/2009 |
| KR | 10-1901900 | B1 | 9/2018 |

OTHER PUBLICATIONS

B. Feichtenschlager et al., "Tuning the self-assembled monolayer formation on nanoparticle surfaces with different curvatures: Investigations on spherical silica particles and plane-crystal-shaped zirconia particles," Journal of Colloid and Interface Science 360 (2011) 15-25.

(Continued)

*Primary Examiner* — Molly K Reida
(74) *Attorney, Agent, or Firm* — Muir Patent Law, PLLC

(57) ABSTRACT

A semiconductor device including a substrate and a capacitor structure arranged on the substrate. The capacitor structure includes a plurality of lower electrodes extending in a vertical direction perpendicular to a surface of the substrate and spaced apart from each other, supporters arranged between the plurality of lower electrodes, an upper electrode spaced apart from each of the plurality of lower electrodes, a dielectric layer arranged between each of the lower electrodes and the upper electrode, and a plurality of particles each in contact with the dielectric layer and arranged between each of the plurality of lower electrodes and the upper electrode.

20 Claims, 13 Drawing Sheets

(56) References Cited

U.S. PATENT DOCUMENTS

| | | | | |
|---|---|---|---|---|
| 2013/0277724 | A1* | 10/2013 | Jun | H10D 1/68 257/296 |
| 2019/0180934 | A1 | 6/2019 | Popovici | |
| 2022/0310780 | A1 | 9/2022 | Ho et al. | |
| 2022/0392996 | A1* | 12/2022 | Takaba | H10D 1/68 |

OTHER PUBLICATIONS

Dun, et al., "Layer-by-Layer Self-Assembly of Multilayer Zirconia Nanoparticles on Silica Spheres for HPLC Packings," Anal. Chem. 2004, 76, 5016-5023.
Mikolajczyk, et al., "Zeta Potential (#) for Metal Oxide Nanoparticles: A Predictive Model Developed by Nano-QSPR Approach," Chemistry of Materials, 2015, 27, 2400-2407.
Wang, et al., "A semiconductor-insulator heterojunction induced by hydroxyl groups formed on the surface of SiO2 microspheres," Applied Surface Science 531 (2020) 147385.
Wang, et al., "Preparation of a composite photocatalyst with enhanced photocatalytic activity: Smaller TiO2 carried on SiO2 microsphere," Applied Surface Science 493 (2019) 146-156.

* cited by examiner

SEMICONDUCTOR DEVICE WITH CAPACITOR STRUCTURE

CROSS-REFERENCE TO RELATED APPLICATION

This application is based on and claims priority under 35 U.S.C. § 119 to Korean Patent Application Nos. 10-2023-0039244, filed on Mar. 24, 2023, and 10-2023-0057746, filed on May 3, 2023, in the Korean Intellectual Property Office, the disclosures of which are incorporated by reference herein in their entireties.

BACKGROUND

Aspects of the inventive concept relates to a semiconductor device.

Electronic devices are becoming smaller and lighter in accordance with the rapid development of the electronics industry and the needs of users. Therefore, high integration is required for semiconductor memory devices used in electronic devices, and design rules for the configurations of semiconductor memory devices are being reduced. Accordingly, it is difficult to secure the reliability of a semiconductor memory device.

SUMMARY

Aspects of the inventive concept provide a semiconductor device having a capacitor structure capable of ensuring reliability.

The task to be solved by the technical idea of the inventive concept is not limited to the above-mentioned task, and other tasks not mentioned may be clearly understood by those of ordinary skill in the art from the following description.

According to an aspect of the inventive concept, there is provided a semiconductor device including a substrate and a capacitor structure arranged on the substrate, wherein the capacitor structure includes a plurality of lower electrodes extending in a vertical direction perpendicular to a surface of the substrate and spaced apart from each other, supporters arranged between the plurality of lower electrodes, an upper electrode spaced apart from each of the plurality of lower electrodes, a dielectric layer arranged between each of the plurality of lower electrodes and the upper electrode, and a plurality of particles each in contact with the dielectric layer and arranged between each of the plurality of lower electrodes and the upper electrode.

In addition, according to another aspect of the inventive concept, there is provided a semiconductor device including a substrate and a capacitor structure arranged on the substrate, wherein the capacitor structure includes a plurality of lower electrodes extending in a vertical direction perpendicular to a surface of the substrate and spaced apart from each other, supporters arranged between the plurality of lower electrodes, an upper electrode spaced apart from each of the plurality of lower electrodes, a dielectric layer arranged between each of the plurality of lower electrodes and the upper electrode, and a plurality of particles each in contact with the dielectric layer and arranged between each of the plurality of lower electrodes and the upper electrode, wherein the plurality of particles include first particles and second particles, the first particles are arranged between the dielectric layer and each of the plurality of lower electrodes, and the second particles are arranged between the dielectric layer and the upper electrode.

In addition, according to another aspect of the inventive concept, there is provided a semiconductor device including a substrate and a capacitor structure arranged on the substrate, wherein the capacitor structure includes a plurality of lower electrodes extending in a vertical direction perpendicular to a surface of the substrate and spaced apart from each other, supporters arranged between the plurality of lower electrodes, an upper electrode spaced apart from each of the plurality of lower electrodes, a dielectric layer arranged between each of the plurality of lower electrodes and the upper electrode, and a plurality of particles each in contact with the dielectric layer and arranged between each of the plurality of lower electrodes and the upper electrode, wherein the plurality of particles include first particles, second particles, and third particles, the first particles are arranged between the dielectric layer and each of the plurality of lower electrodes, and the second particles and the third particles are arranged between the dielectric layer and the upper electrode, and wherein the supporters include a first supporter and a second supporter, the first supporter is arranged between the second supporter and the substrate, the second supporter is arranged on the first supporter, facing the first supporter, and the plurality of lower electrodes include at least one of Ti, Ta, W, and Ru.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
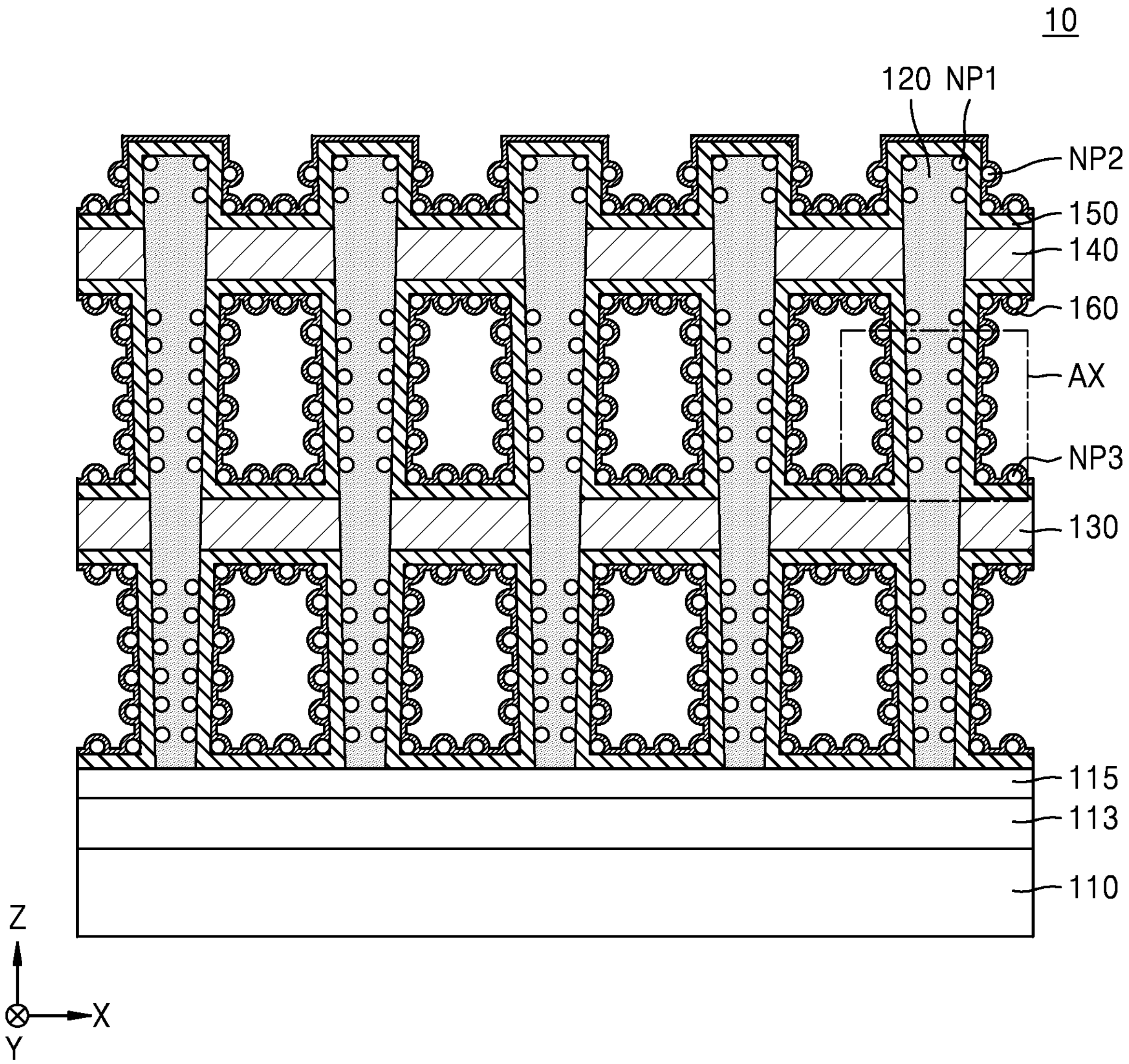
FIG. 1 is a cross-sectional view illustrating a semiconductor device according to an embodiment.

Hereinafter, embodiments of the inventive concept will be described in detail with reference to the accompanying drawings. The same reference numerals are used for the same components in the drawings, and redundant descriptions thereof will be omitted.

Figure 2:
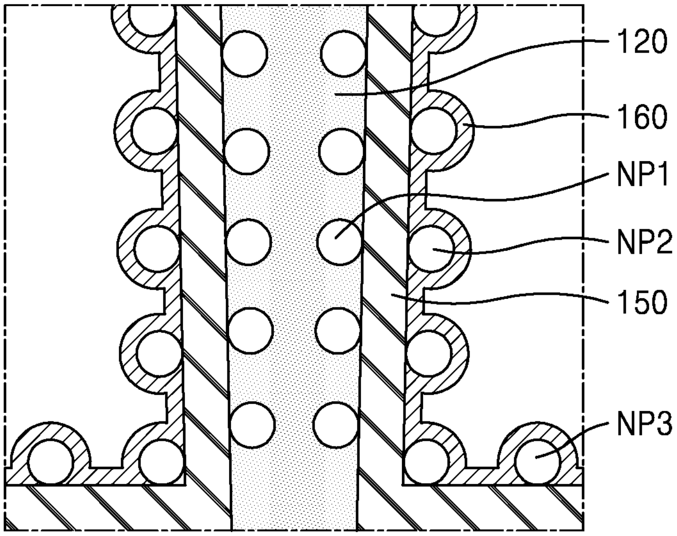
FIG. 2 is an enlarged view of a portion AX of FIG. 1.

FIG. 1 is a cross-sectional view illustrating a semiconductor device according to an embodiment. FIG. 2 is an enlarged view of a portion AX of FIG. 1.

Referring to FIG. 1, a semiconductor device 10 may include a substrate 110, an interlayer insulating layer 113, an etch stop layer 115, and a capacitor structure arranged on the substrate 110. The capacitor structure may include a plurality of lower electrodes 120, a supporter, a dielectric layer 150, and an upper electrode 160. The supporter may include a first supporter 130 and a second supporter 140. A dielectric layer 150 and an upper electrode 160 may be formed on each of the plurality of lower electrodes 120, the first supporter 130, and the second supporter 140.

The substrate 110 may include, for example, a semiconductor material such as silicon, germanium, silicon-germanium, and the like and may further include an epitaxial layer, a silicon on insulator (SOI) layer, a germanium on insulator (GOI) layer, a semiconductor on insulator (SeOI) layer, and the like. The substrate 110 may include a semiconductor substrate and semiconductor devices. For example, the semiconductor devices may include metal oxide semiconductor (MOS) transistors, diodes and resistors. Gate lines and bit lines may be formed on the substrate 100.

The interlayer insulating layer 113 may be formed of a high density plasma (HDP) oxide layer, TetraEthyl OrthoSilicate (TEOS), Plasma Enhanced TetraEthyl OrthoSilicate (PE-TEOS), O3-TetraEthyl OrthoSilicate (O3-TEOS), Undoped Silicate Glass (USG), Phospho Silicate Glass (PSG), Borosilicate Glass (BSG), BoroPhosphoSilicate Glass (BPSG), Fluoride Silicate Glass (FSG), Spin On Glass (SOG), Tonen SilaZene (TOSZ) or a combination thereof. In addition, the interlayer insulating layer 113 may be made of silicon nitride, silicon oxynitride, or a material having a low dielectric constant, for example, a material having a lower dielectric constant than silicon oxide.

The etch stop layer 115 may be formed of a material having etch selectivity with respect to the planarized interlayer insulating layer 113. For example, the etch stop layer 115 may be formed of a silicon nitride layer or a silicon oxynitride layer.

The plurality of lower electrodes 120 may include at least one of metal materials, metal nitride layers, and metal silicide. For example, the plurality of lower electrodes 120 may be formed of refractory metal materials such as cobalt, titanium, nickel, tungsten, and molybdenum. As another example, the plurality of lower electrodes 120 may be formed of metal nitride layers such as layers of titanium nitride (TiN), titanium silicon nitride (TiSiN), titanium aluminum nitride (TiAlN), tantalum silicon nitride (TaN), tantalum silicon nitride (TaSlN), tantalum aluminum nitride (TaAlN), and tungsten nitride (WN). In addition, each of the plurality of lower electrodes 120 may be formed of at least one noble metal layer selected from the group consisting of platinum (Pt), ruthenium (Ru), and iridium (Ir). The plurality of lower electrodes 120 may be formed of a noble metal conductive oxide layer.

Each of the plurality of lower electrodes 120 may have an elongated shape extending in a third direction (Z) on the substrate 110. The third direction (Z) (e.g., vertical direction) is perpendicular to both the first direction (X) and the second direction (Y), which are parallel to the main (e.g., first) surface of the substrate 110. Here, the first direction X may be referred to as a first horizontal direction, the second direction Y may be referred to as a second horizontal direction, and the third direction Z may be referred to as a vertical direction. The plurality of lower electrodes 120 may be arranged in the first direction (X) and the second direction (Y) to form a plurality of rows and a plurality of columns. In this case, in order to secure space between the plurality of lower electrodes 120, the plurality of lower electrodes 120 constituting one row may be arranged alternately with the plurality of lower electrodes 120 constituting another adjacent row. In this way, by arranging the plurality of lower electrodes 120 alternately, the plurality of lower electrodes 120 have a relatively large space between the plurality of lower electrodes 120, which may contribute to the deposition of dielectric materials in subsequent processes such as dielectric deposition processes.

In embodiments, the plurality of lower electrodes 120 may have a tapered shape in the vertical direction. In addition, in embodiments, each of the plurality of lower electrodes 120 may be formed in a pillar structure, and the cross-section of the plurality of lower electrodes 120 may be circular or elliptical. In other embodiments, the plurality of lower electrodes 120 may have a cylinder shape with a closed lower part. However, the embodiments are not limited thereto.

In one embodiment, the plurality of lower electrodes 120 may have an aspect ratio, which is a ratio of height to width, in a range of about 10 to about 35. As the aspect ratio of each of the plurality of lower electrodes 120 increases, the lower electrodes 120 may collapse or break. Accordingly, the semiconductor device 10 may further include a first supporter 130 and a second supporter 140 to prevent the collapse of the plurality of lower electrodes 120. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In this case, the first supporter 130 and the second supporter 140 may include nitride but are not limited thereto. The semiconductor device 10 is shown to include two supporters, such as the first supporter 130 and the second supporter 140, but is not limited thereto, and may include only a second supporter 140, or may include more than two supporters therein depending on the aspect ratio of each of the plurality of lower electrodes 120. The first supporter 130 may be arranged between the second supporter 140 and the substrate 110. The second supporter 140 may be arranged above the first supporter 130 and may face the first supporter 130.

The first supporter 130 may be formed in an integral type including a plurality of first open areas (not shown), and the second supporter 140 may be formed in an integral type including a plurality of second open areas (not shown). For example, each of the first supporter 130 and the second supporter 140 may have a structure in which supporters are connected to each other. The first supporter 130 and the second supporter 140 may have a flat plate shape parallel to the main surface of the substrate 110 at a predetermined height (e.g., in the vertical direction) from the main surface of the substrate 110.

The first supporter 130 may be formed at a lower vertical level from the main surface of the substrate 110 than the second supporter 140. For example, measured along the vertical direction, the distance between the first supporter 130 and the substrate 110 may be less than the distance between the second supporter 140 and the substrate 110. The plurality of first open areas and the plurality of second open areas may overlap each other in a direction perpendicular to the main surface of the substrate 110. In this case, a cross-sectional area of each of the plurality of first open areas may be smaller than a cross-sectional area of each of the plurality of second open areas.

Here, opening the plurality of lower electrodes 120 by the plurality of first and second open areas refers to the structure of the first and second supporters 130 and 140 before the deposition of the dielectric layer 150 and the upper electrode 160. After the dielectric layer 150 and the upper electrode 160 are formed, the plurality of lower electrodes 120 are covered with the dielectric layer 150 and the upper electrode 160, so the plurality of lower electrodes 120 may not be opened (i.e., exposed) through the plurality of first and second open areas. Therefore, the plurality of first open areas and the plurality of second open areas may be understood as areas in which the first supporter 130 and the second supporter 140 are not in contact with each other at the level where the first supporter 130 and the second supporter 140 are formed from the main surface of the substrate 110, prior to the deposition of the dielectric layer 150 and the upper electrode 160. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting," "in contact with," or "contact" another element, there are no intervening elements present at the point of contact The dielectric layer 150 may conformally cover surfaces of the plurality of lower electrodes 120. In embodiments, the dielectric layer 150 may be integrally formed to cover the plurality of lower electrodes 120 together within a certain area, for example, one memory cell area. In some other embodiments, the dielectric layer 150 may be formed to cover the memory cell area and a peripheral area together.

Referring to FIGS. 1 and 2, the capacitor structure may include particles (e.g., nanoparticles). The particles may include first particles NP1, second particles NP2, and third particles NP3. In embodiments, each of the first particles NP1, the second particles NP2, and the third particles NP3 may be formed of the same material. Each of the first particles NP1, the second particles NP2, and the third particles NP3 may be formed of and/or include TaO, TaAlO, TaON, AlO, AlSlO, HfO, HfSiO, ZrO, ZrSiO, TiO, TiAlO, (Ba, Sr)TiO (BST), SrTiO (STO), BaTIO (BTO), Pb(Zr, Ti)O (PZT), (Pb,La)(Zr,Ti)O, Ba(Zr,Ti)O, Sr(Zr,Ti)O, or a combination thereof.

In embodiments, each of the first particles NP1, the second particles NP2, and the third particles NP3 may have a size in a range of about 1 nm to about 5 nm. Here, the size may mean a diameter. In embodiments, each of the first particles NP1, the second particles NP2, and the third particles NP3 may be in contact with the dielectric layer 150. In embodiments, each of the first particles NP1, the second particles NP2, and the third particles NP3 may be covalently bonded to the surface of the dielectric layer 150.

In addition, each of the first particles NP1, the second particles NP2, and the third particles NP3 may be arranged between each of the plurality of lower electrodes 120 and the upper electrode 160. The first particles NP1 may be surrounded by the plurality of lower electrodes 120 and the dielectric layer 150. Specifically, a part of the first particles NP1 may be in contact with each of the plurality of lower electrodes 120, and another part of the first particles NP1 may be in contact with the dielectric layer 150. In embodiments, the first particles NP1 may be arranged along a portion of the inner sidewalls of the plurality of lower electrodes 120. Each of the first particles NP1, the second particles NP2, and the third particles NP3 may have any one of a spherical shape and a hemispherical shape.

In addition, in embodiments, the first particles NP1 may not be arranged on the other part of the inner sidewall of each of the plurality of lower electrodes 120 in contact with either of the first supporter 130 or the second supporter 140. For example, the first particles NP1 may not be arranged on an area of the lower electrodes 120 that is in contact with one of the first supporter 130 and the second supporter 140. In addition, the first particles NP1, the second particles NP2, and the third particles NP3 may not be in contact with the first supporter 130 and the second supporter 140. The first particles NP1, the second particles NP2, and the third particles NP3 may not be arranged on the same vertical level (i.e., level in the vertical direction) as the first supporter 130 and the second supporter 140 in the vertical direction.

The second particles NP2 may not be in contact with the plurality of lower electrodes 120. The second particles NP2 may be arranged between the dielectric layer 150 and the upper electrode 160, and the second particles NP2 may be surrounded by the dielectric layer 150 and the upper electrode 160. In addition, the second particles NP2 may be spaced apart from the first particles NP1 with the dielectric layer 150 therebetween and may be arranged alternately with respect to the first particles NP1. The second particles NP2 may be arranged on the dielectric layer 150 in the vertical direction (e.g., Z direction), the extending direction of the inner sidewalls of the plurality of lower electrodes 120).

The third particles NP3 may not be in contact with the plurality of lower electrodes 120. The third particles NP3 may be surrounded by the dielectric layer 150 and the upper electrode 160. In embodiments, the third particles NP3 may be arranged on the dielectric layer 150 in the horizontal direction (e.g., X direction), the extending direction of the first supporter 130. In embodiments, the third particles NP3 may be arranged on the dielectric layer 150 in the extending direction (e.g., X direction) of the second supporter 140. For example, the extending direction of the second supporter 140 may be a direction that intersects the vertical direction.

The third particles NP3 may be arranged apart from the first supporter 130 and the second supporter 140 and may be arranged spaced apart from the first supporter 130 and the second supporter 140 above and below the first supporter 130 and the second supporter 140. A part of the second particles NP2 and a part of the third particles NP3 may be in contact with the dielectric layer 150, and another part of the second particles NP2 and another part of the third particles NP3 may be covered with the upper electrode 160.

Figure 3:
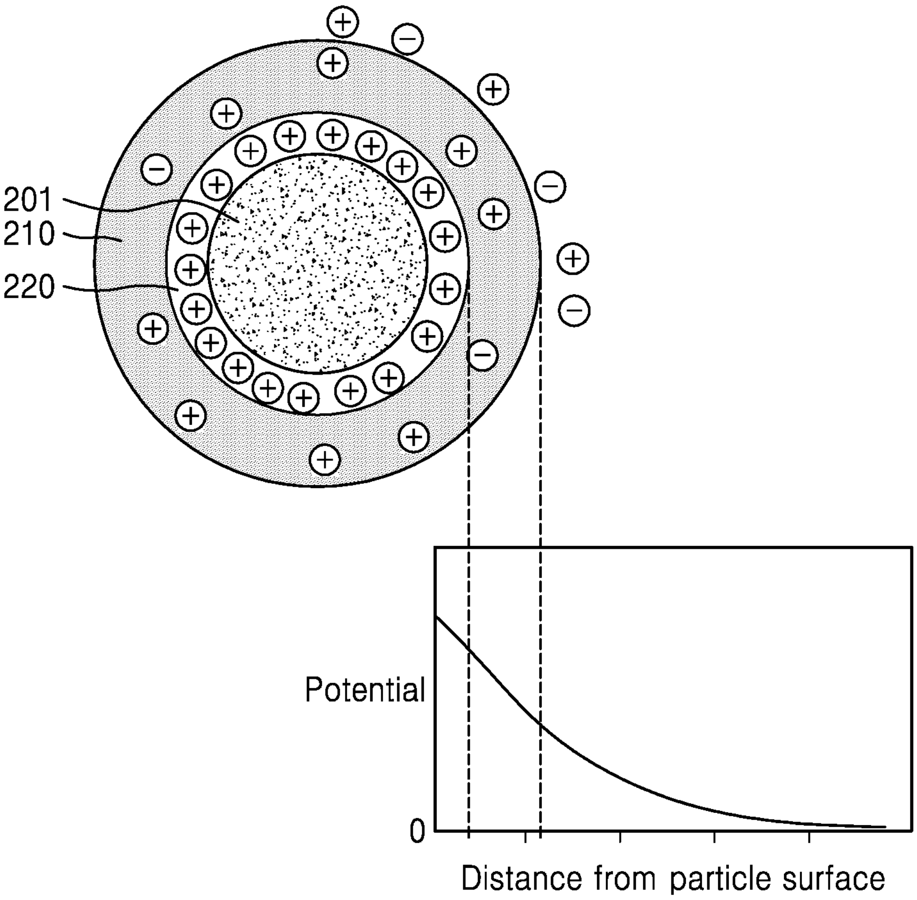
FIG. 3 is a diagram illustrating a zeta potential of particles according to an embodiment.
Figure 4A:
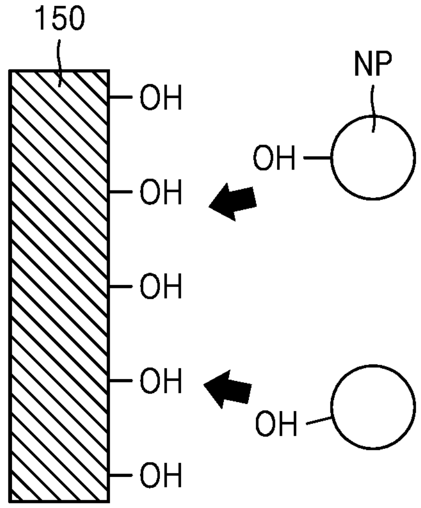
FIGS. 4A and 4B are flowcharts illustrating a bonding relationship between a dielectric layer and particles according to an embodiment.
Figure 4B:
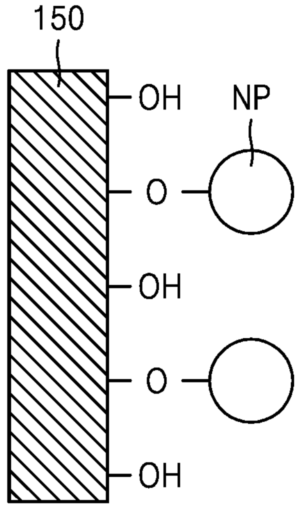

FIG. 3 is a diagram illustrating a zeta potential of particles according to an embodiment. FIGS. 4A and 4B are flowcharts illustrating a bonding relationship between a dielectric layer and particles according to an embodiment.

Referring to FIG. 3, particles 201 in an aqueous solution may have a Zeta potential through pH solution treatment in a method of manufacturing a semiconductor device to be described later. Here, the particles 201 may be positively (+) or negatively (−) charged. Here, the particles 201 may form an electrical double layer.

The electrical double layer may include a stern layer 210 formed on the surface of the particles 201 and a diffuse layer, which is an outer layer of the stern layer 210. Ions having charges opposite to those of the particles 201 may be strongly bonded to the stern layer 210. In the diffusion layer 220, ions of the same charges as of the particles 201 and ions of the opposite charges of the particles 201 may be weakly bonded to each other. In this case, the potential in the diffusion layer 220 is referred to as a zeta potential. The surface charge amount of the particles 201 may be controlled by adjusting the Zeta potential according to the pH change of the pH solution. The charges of the particles 201 may be adjusted to be opposite to the charges of the dielectric layer 150 through the control of the surface charge amount of the particles 201. Accordingly, the particles 201 may be controlled to be adsorbed onto the dielectric layer 150.

Referring to FIGS. 4A and 4B, each of the particles NP has a Zeta potential by the pH solution described above with reference to FIG. 3, and may be moved and adsorbed to the dielectric layer 150. Here, the particles NP before being bound to the dielectric layer 150 may be in a colloidal state. In this case, the particles NP and the dielectric layer 150 before adsorption may have opposite charges to each other. Thereafter, the hydroxyl group of the dielectric layer 150 formed through the activation treatment and the hydroxyl group of the particles NP may be bonded. The hydroxyl group of the dielectric layer 150 and the hydroxyl group of the particles NP may be bonded to form an oxygen covalent bond. Accordingly, the particles NP may be fixedly coupled to the dielectric layer 150.

Figure 5:
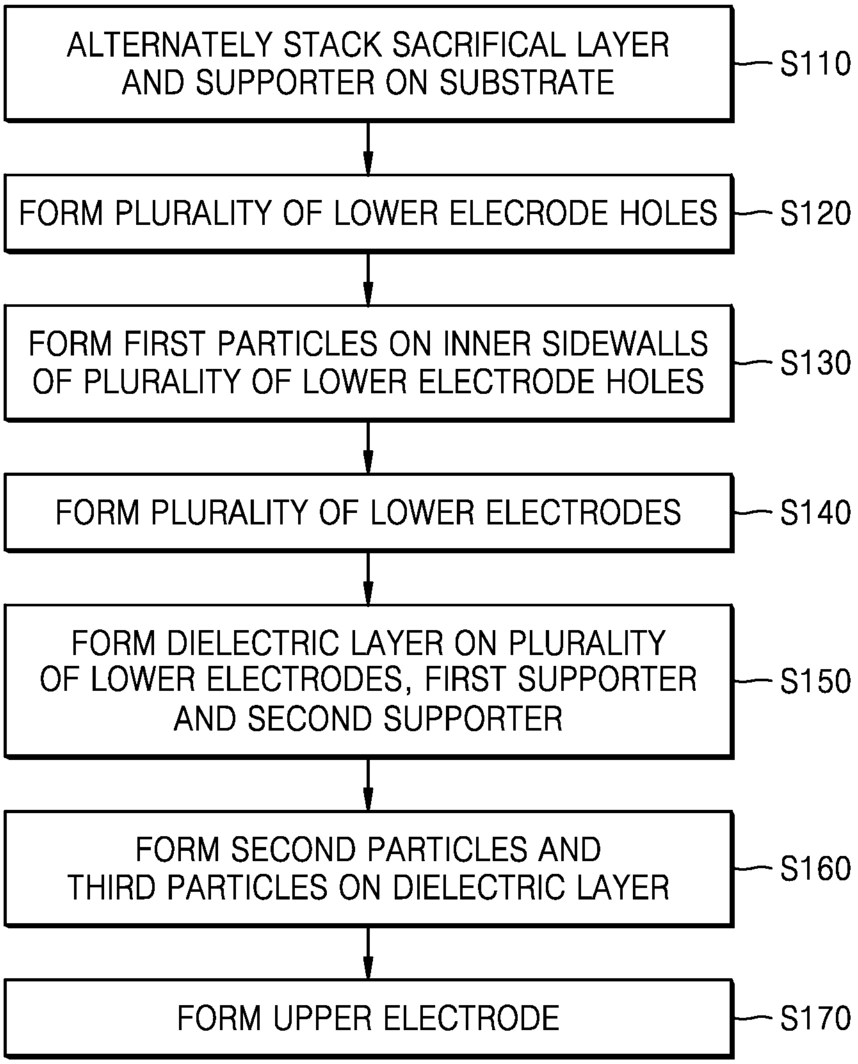
FIG. 5 is a flowchart illustrating a method of manufacturing a semiconductor device, according to an embodiment.

FIG. 5 is a flowchart illustrating a method of manufacturing a semiconductor device, according to an embodiment. FIGS. 6A to 6G are cross-sectional views illustrating a method of manufacturing a semiconductor device, according to an embodiment.

Figure 6A:
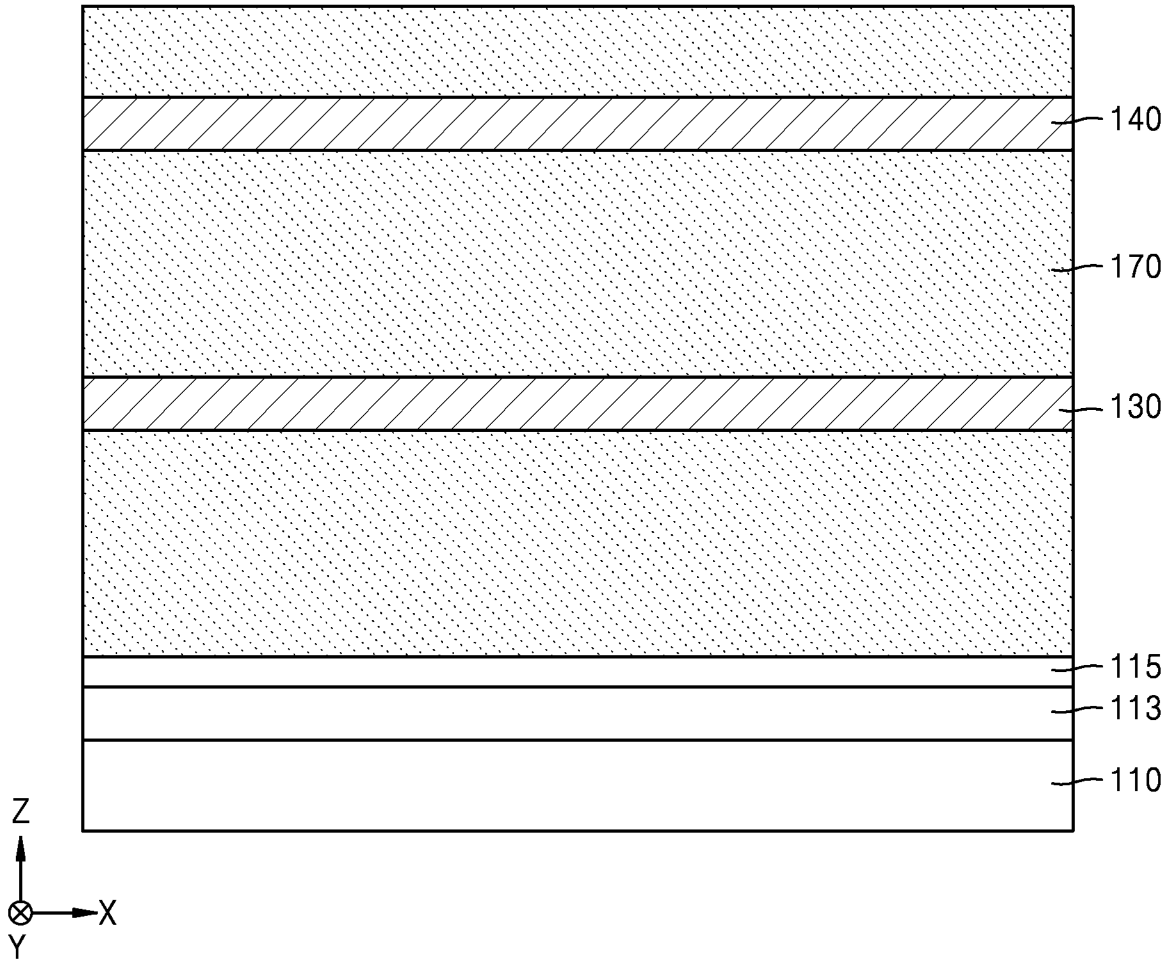
FIGS. 6A to 6G are cross-sectional views illustrating a method of manufacturing a semiconductor device, according to an embodiment.

Referring to FIGS. 5 and 6A, the semiconductor device manufacturing method according to aspects of the inventive concept may first alternately stack a sacrificial layer 170 and a supporter on a substrate 110 (S110). A contact plug (not shown) may be formed in the interlayer insulating layer 113 on the substrate 110. Next, after an etch stop layer 115 is formed on the upper surface of the interlayer insulating layer 113 and the contact plug, the sacrificial layer 170 may be formed on the etch stop layer 115. The substrate 110 may include a semiconductor substrate and semiconductor devices. Gate lines and bit lines may be formed on the semiconductor substrate, and the contact plug may be connected to the source/drain electrodes of a MOS transistor formed on the substrate 110.

The etch stop layer 115 may be formed of, for example, a combination of Si or Ge and at least one of O, N, C, B, H, and F. The etch stop layer 115 may be formed of, for example, SiO, SiN, SiCN, SiON, SiBN, or the like. In embodiments, the etch stop layer 115 may be made of silicon oxynitride or silicon nitride. For example, the etch stop layer 115 may be formed to have a thickness of about 300 Å to about 1500 Å.

The etch stop layer 115 may be formed of a material having etch selectivity with respect to the planarized interlayer insulating layer 113 and the planarized sacrificial layer 170. For example, the etch stop layer 115 may be formed of a silicon nitride layer or a silicon oxynitride layer. The sacrificial layer 170 may include an oxide layer. For example, the sacrificial layer 170 may include an oxide layer such as BPSG, SOD, PSG, LPTEOS, or PETEOS. The first supporter 130 may be formed on the sacrificial layer 170.

The first supporter 130 may be a layer for preventing the lower electrodes from collapsing during a subsequent wet etching process. For example, the first supporter 130 may be formed of a nitride layer. In addition, although not illustrated, a first buffer layer may be further formed between the sacrificial layer 170 and the first supporter 130. In this case, the first buffer layer may be formed of a material having etch selectivity with respect to the sacrificial layer 170 and the first supporter 130. The first buffer layer may be used as an etch stop layer in the operation of etching the first supporter 130 and may prevent damage to the sacrificial layer 170 in subsequent processes.

Subsequently, the sacrificial layer 170 and the second supporter 140 may be sequentially formed on the first supporter 130. The first supporter 130 and the second supporter 140 may be formed of the same material, but are not limited thereto, and may be formed of different materials. In addition, the sacrificial layer 170 may be additionally stacked on the second supporter 140. In addition, in embodiments, a second buffer layer may be further formed between the sacrificial layer 170 and the second supporter 140. However, the embodiments are not limited thereto. For example, in an embodiment the first supporter 130 is not formed, and only the second supporter 140 may be formed on the substrate 110.

A first mask pattern including a plurality of first open holes may be formed on the second supporter 140. The plurality of first open holes may be formed in a circular shape. The first mask pattern may expose a portion of the sacrificial layer 170. In embodiments, the first mask pattern may be formed of a plurality of layers, and the plurality of layers may include a material having etch selectivity with respect to the sacrificial layer 170, the first supporter 130, and the second supporter 140.

Figure 6B:
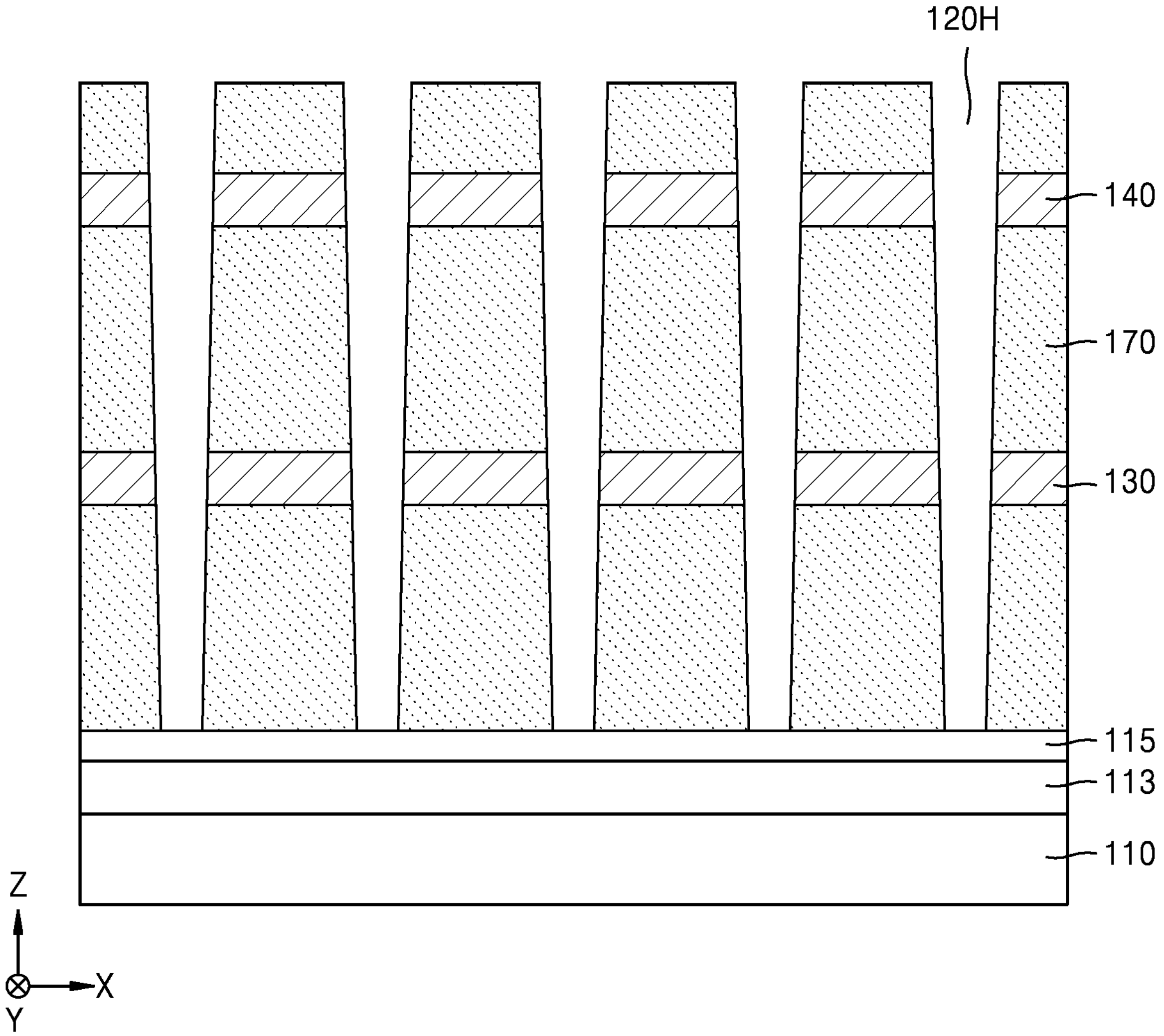

Referring to FIGS. 5 and 6B, the sacrificial layer 170, the first supporter 130, and the second supporter 140 may be formed, and then the first mask pattern including the plurality of first open holes may be used as an etching mask to etch the sacrificial layer 170, the first supporter 130, and the second supporter 140 and form a plurality of lower electrode holes 120H (S120). An upper surface of the contact plug may be exposed by the plurality of lower electrode holes 120H. When the formation of the plurality of lower electrode holes 120H is completed through the etching process, the first mask pattern may be removed.

In embodiments, the process of forming the plurality of lower electrode holes 120H may include exposing the sacrificial layer 170 by plasma anisotropic etching of the second supporter 140, exposing the first supporter 130 by plasma anisotropic etching of the sacrificial layer 170, exposing the sacrificial layer 170 by plasma anisotropic etching of the first supporter 130, and plasma anisotropic etching the first mold layer 161L. In this case, when the sacrificial layer 170 is plasma-anisotropically etched and then the first supporter 130 is anisotropically etched, an etching gas for etching the first supporter 130 may damage a sidewall of the exposed sacrificial layer 170 or generate a polymer. Accordingly, a passivation layer may be further formed on the sidewall of the sacrificial layer 170 before anisotropic etching of the first supporter 130.

In embodiments, the plurality of lower electrode holes 120H may be arranged in the first direction X and the second direction Y in a direction parallel to the main surface of the substrate 110. For example, the plurality of lower electrode holes 120H may be arranged on the substrate 110 in a matrix structure.

Figure 6C:
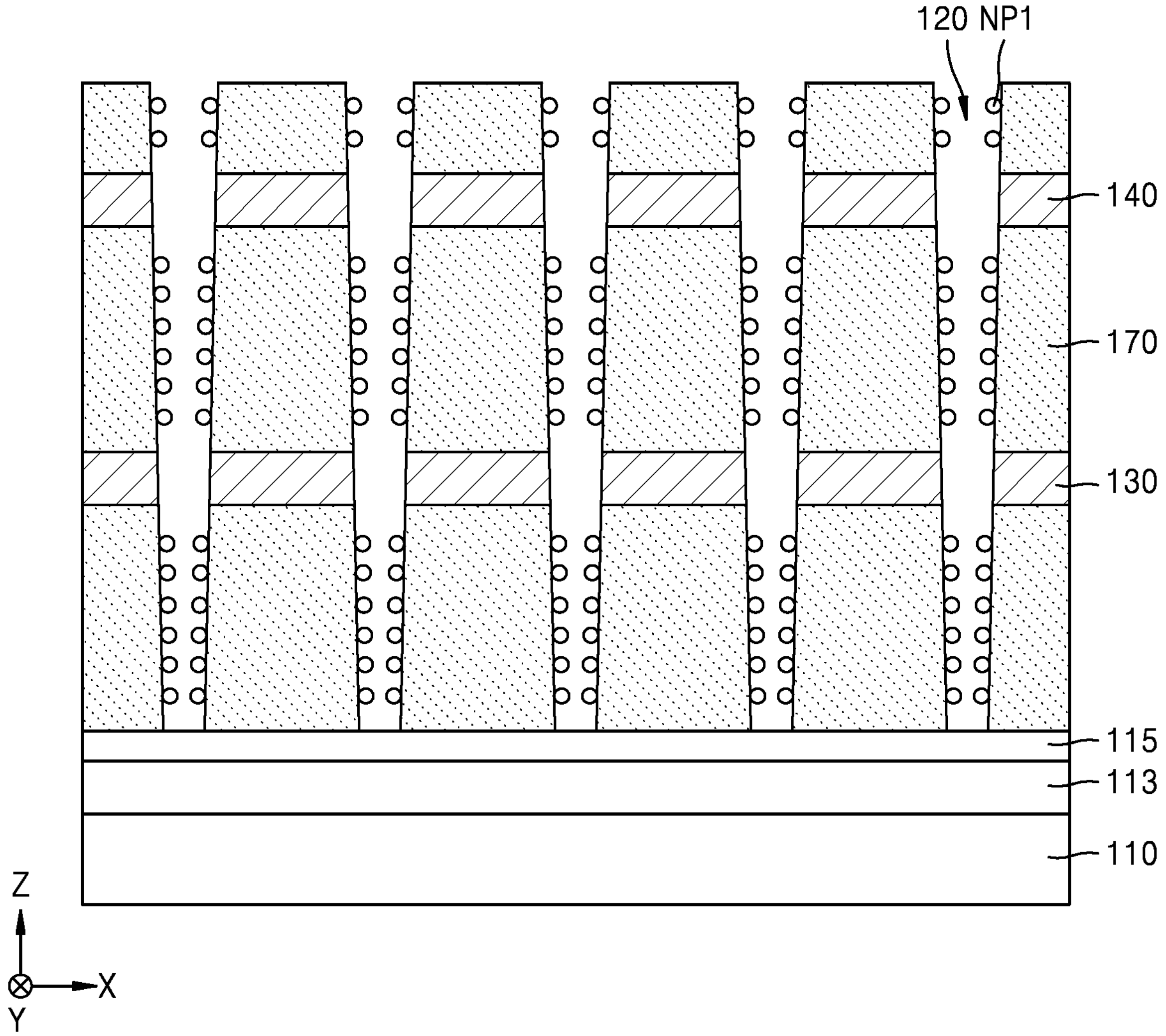

Referring to FIGS. 5 and 6C, the plurality of lower electrode holes 120H may be formed, and then first particles NP1 may be formed on an inner sidewall of each of the plurality of lower electrode holes 120H (S130). In this case, the first particles NP1 may be deposited on the sacrificial layer 170 and may not be formed on the first supporter 130 and the second supporter 140. The method of forming the first particles NP1 may include first performing a surface activation process on the surface of the sacrificial layer 170. The surface activation process may be performed using any one of a dry process and a wet process.

In embodiments, in the case of a dry process for the surface activation process, hydrogen radicals may be generated using hydrogen plasma. Accordingly, a hydroxyl functional group may be formed on the surface of the sacrificial layer 170 in each of the plurality of lower electrode holes 120H. In other embodiments, in the case of a wet process for the surface activation process, a hydroxyl functional group may be formed on the surface of the sacrificial layer 170 in each of the plurality of lower electrode holes 120H using a strong base such as NaOH or KOH.

After the hydroxyl functional group is formed on the surface of the sacrificial layer 170 through the surface activation process, colloidal particles may be applied to the inner sidewall of each of the plurality of lower electrode holes 120H. In this case, the colloidal particles may be adjusted to a charge opposite to the charge of the sacrificial layer 170 through a pH solution. Accordingly, the particles may be adsorbed and fixed to the surface of the sacrificial layer 170. The particles may form a covalent bond with the surface of the sacrificial layer 170 by hydrolysis and dehydration condensation. By the covalent bond, the particles may be fixed to the surface of the sacrificial layer 170. In this case, repulsion is applied to additional particles by particles adsorbed and fixed on the surface of the sacrificial layer 170, and adsorption of additional particles on the inner sidewall of each of the plurality of lower electrode holes 120H may be prevented.

Figure 6D:
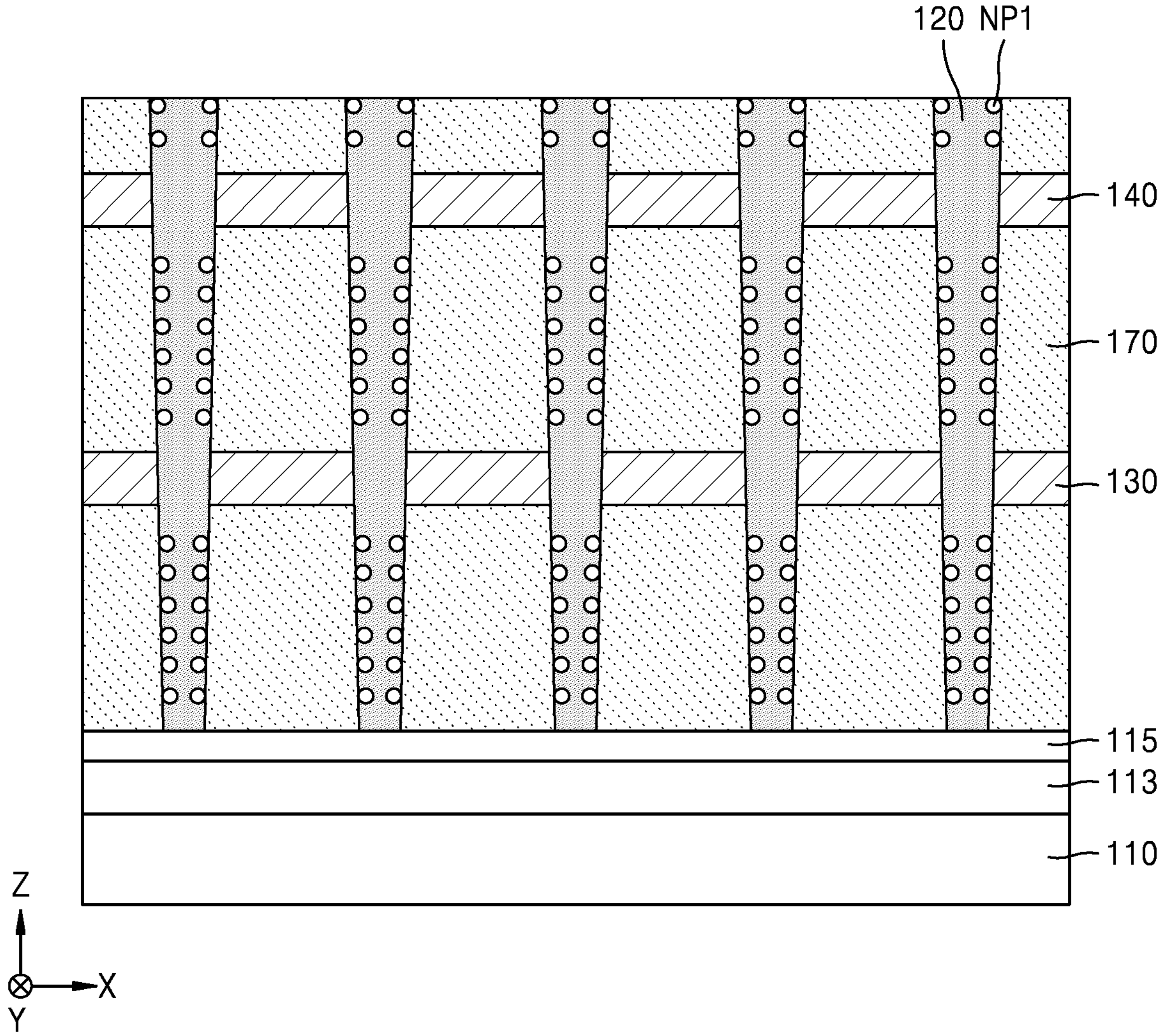

Referring to FIGS. 5 and 6D, after forming the first particles, the plurality of lower electrodes 120 may be formed (S140). Specifically, a conductive layer may be deposited on the plurality of lower electrode holes 120H (of FIG. 6C). Next, a process of separating the plurality of lower electrodes 120 from each other may be performed. The process of separating the plurality of lower electrodes 120 may include performing a planarization process to remove the conductive layer deposited on the sacrificial layer 170.

The plurality of lower electrodes 120 may be formed by depositing a conductive layer through chemical vapor deposition (CVD), physical vapor deposition (PVD), atomic layer deposition (ALD), or the like to have excellent step-coverage characteristics. The conductive layer may be deposited to a thickness equal to or more than half of the width of each of the plurality of lower electrode holes, thereby completely filling each of the plurality of lower electrode holes. Accordingly, the plurality of lower electrodes 120 having a pillar-shaped structure may be formed as shown in the drawings. According to another embodiment, the conductive layer may conformally cover the inner sidewalls of the plurality of lower electrode holes with a thickness equal to or less than half the width of each of the plurality of lower electrode holes. In this case, after depositing the conductive layer, a sacrificial layer filling each of the plurality of lower electrode holes may be formed on the conductive layer, or the plurality of lower electrodes in the form of a cylinder may be formed. Here, the plurality of lower electrodes 120 may include at least one of metal materials, metal nitride layers, and metal silicide.

After the conductive layer is deposited on each of the plurality of lower electrode holes, a plasma treatment and a heat treatment process for removing impurities generated during the deposition of the conductive layer may be additionally performed. Nitrogen and oxygen plasma may be used in the plasma treatment process. The planarization process performed after depositing the conductive layer may be, for example, a chemical mechanical polishing process or a dry etch back process.

Figure 6E:
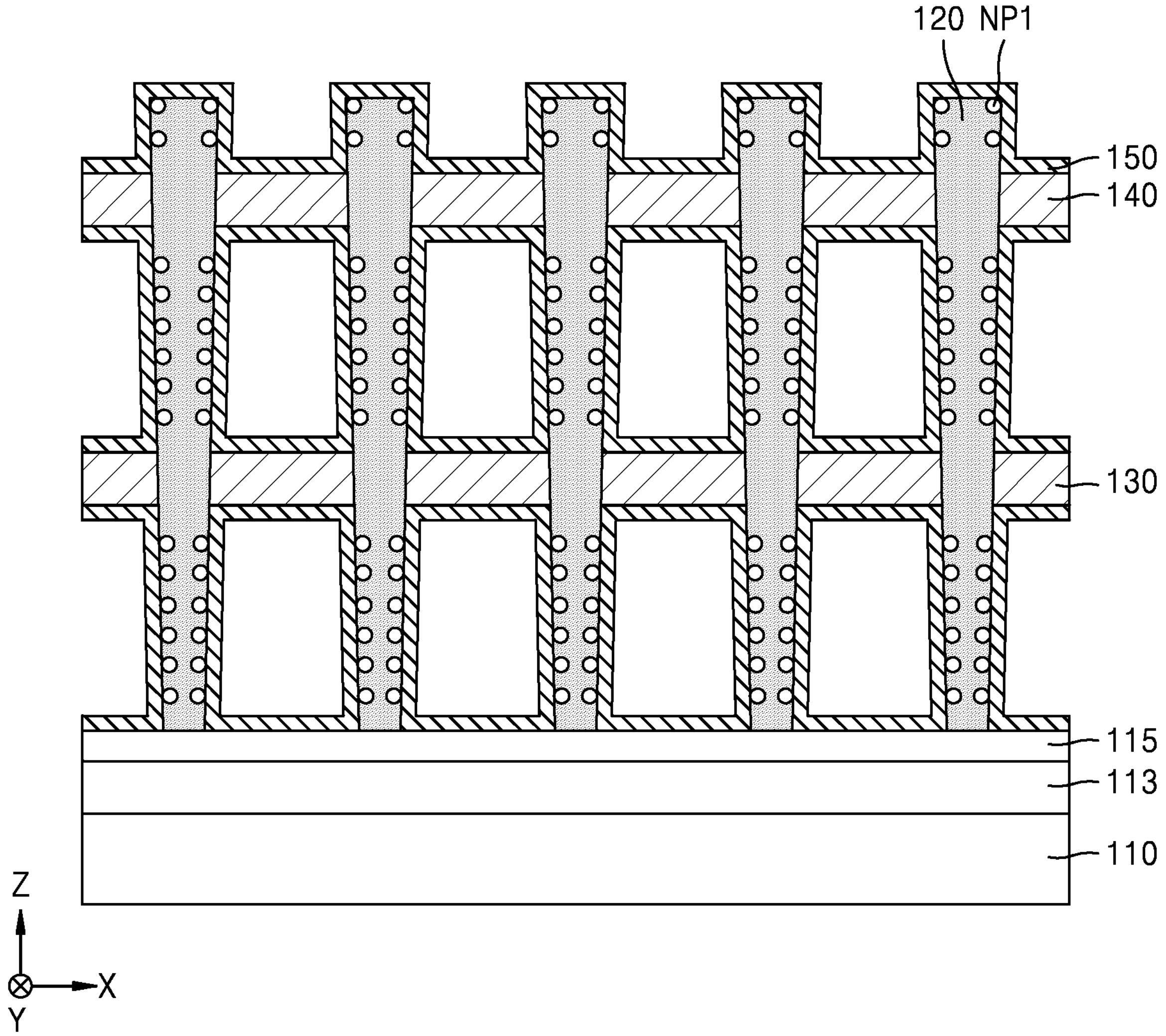

Referring to FIGS. 5, 6D, and 6E, after forming the plurality of lower electrodes 120, the sacrificial layer 170 may be removed and a dielectric layer 150 may be formed on the plurality of lower electrodes 120, the first supporter 130, and the second supporter 140 (S150). The sacrificial layer 170 may be entirely removed through a wet etching process. For example, when the sacrificial layer 170 is formed of an oxide, the wet etching process may be performed using a wet etching solution. For example, the wet etching process may be a limulus amebocyte lysate (LAL) lift-off process using a LAL solution containing hydrogen fluoride (HF). The wet etchant may etch and remove the sacrificial layer 170. The first supporter 130 and the second supporter 140 may firmly fix the plurality of lower electrodes 120 so that they do not collapse while etching and removing the sacrificial layer 170. In addition, the dielectric layer 150 may be deposited to have excellent step-coverage characteristics through CVD, PVD, ALD, or the like.

Figure 6F:
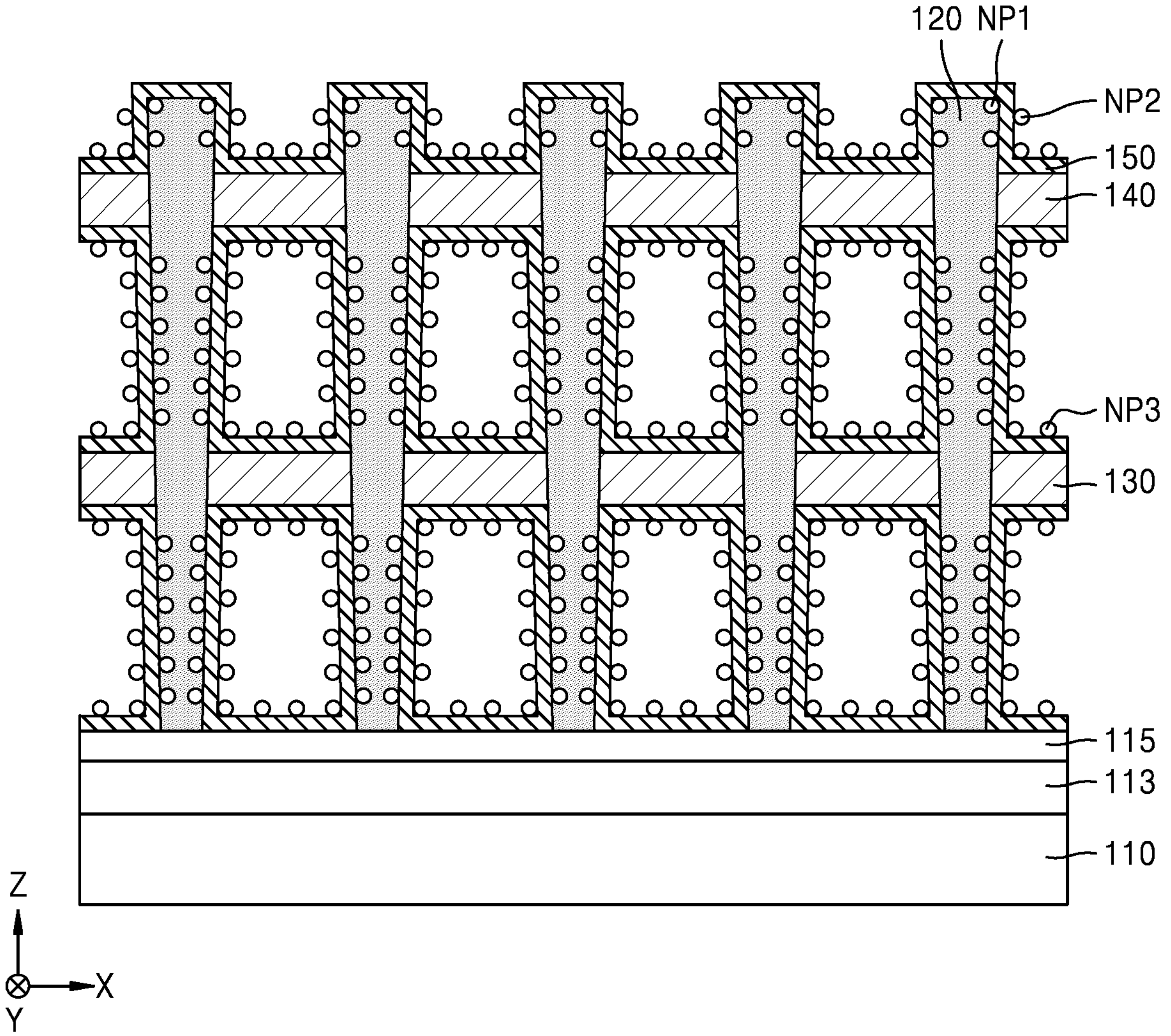

Referring to FIGS. 5 and 6F, after the dielectric layer 150 is formed, second particles NP2 and third particles NP3 may be formed on the dielectric layer 150 (S160). In this case, the second particles NP2 and the third particles NP3 may be covalently bonded to the surface of the dielectric layer 150. Like the first particles NP1, the second particles NP2 and the third particles NP3 may perform the surface activation process for forming a hydroxyl group on the dielectric layer 150. In this case, the surface activation process may be performed using any one of the dry process and wet process.

Next, the second particles NP2 and the third particles NP3 are attached to the dielectric layer 150 by the zeta potential of the second particles NP2 and the third particles NP3, and covalent bonding may be formed between each of the second particles NP2 and the third particles NP3 and the dielectric layer 150 by hydrolysis and dehydration synthesis between the hydroxyl of the dielectric layer 150 and the hydroxyl group of the second particles NP2 or the hydroxyl group of the third particles NP3. Accordingly, the second particles NP2 and the third particles NP3 may be fixedly coupled to the surface of the dielectric layer 150.

Figure 6G:
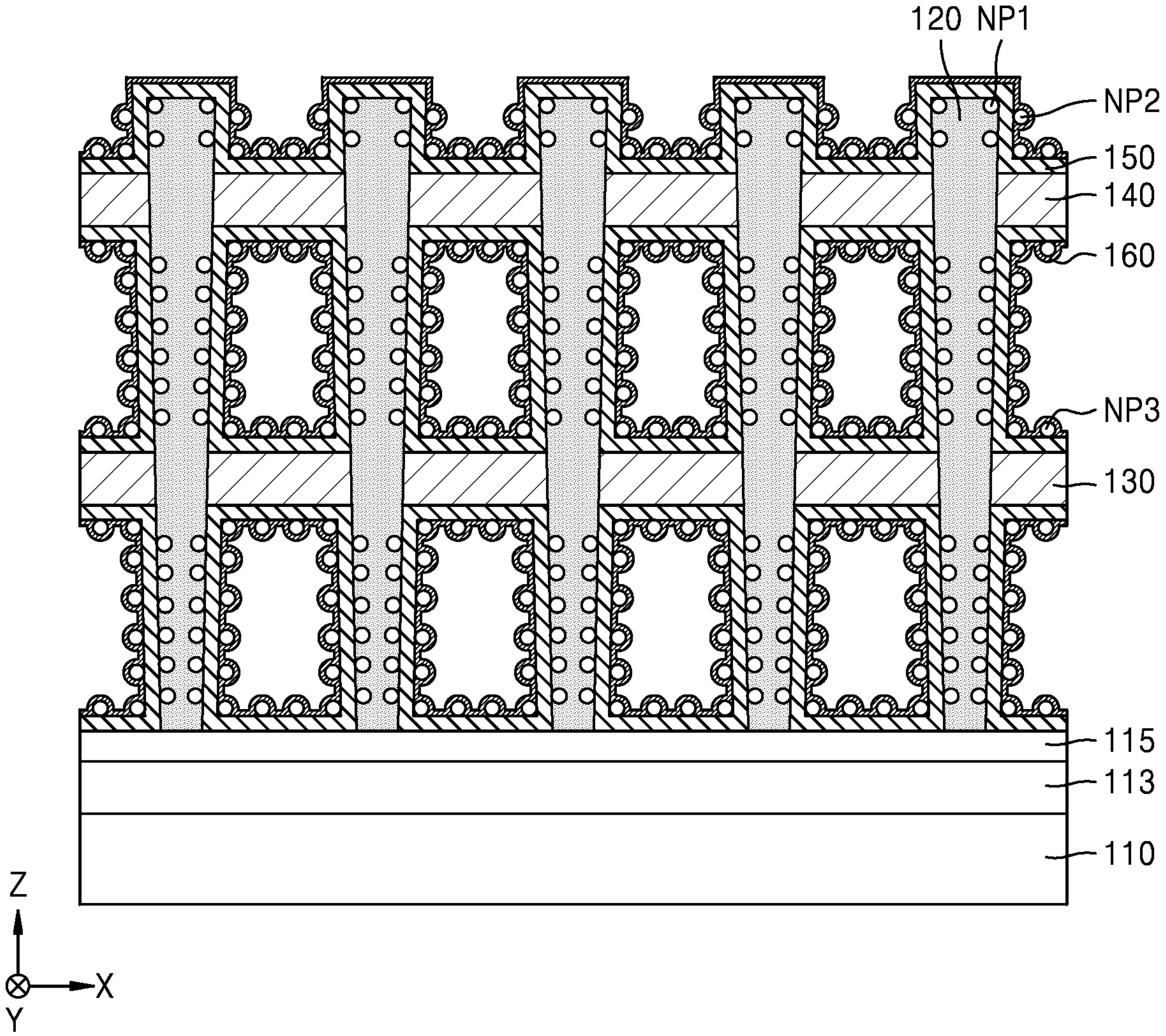

Referring to FIGS. 5 and 6G, the second particles NP2 and the third particles NP3 may be formed on the dielectric layer 150 and then the upper electrode 160 may be formed (S170). The upper electrode 160 may conformally cover the dielectric layer 150, the second particles NP2, and the third particles NP3. In embodiments, an additional upper electrode may be further formed in addition to the upper electrode 160. After the upper electrode 160 is formed, a plasma treatment and heat treatment process may be performed to remove impurities generated during deposition of the upper conductive layer. Nitrogen and hydrogen plasma may be used in the plasma treatment process.

In this way, the surface area of the dielectric layer 150 may be increased by forming a plurality of particles inside the plurality of lower electrodes 120 in contact with the dielectric layer 150 and in the space between the upper electrode 160 and the dielectric layer 150. Accordingly, the capacity of the capacitor may be efficiently increased while maintaining the structure of the capacitor. In this way, the reliability and stability of the semiconductor device may be improved by increasing the surface area of the capacitor.

While aspects of the inventive concept has been particularly shown and described with reference to embodiments thereof, it will be understood that various changes in form and details may be made therein without departing from the spirit and scope of the following claims.

What is claimed is:

1. A semiconductor device comprising:

a substrate; and a capacitor structure arranged on the substrate, wherein the capacitor structure includes a plurality of lower electrodes extending in a vertical direction perpendicular to a surface of the substrate and spaced apart from each other, supporters arranged between the plurality of lower electrodes, an upper electrode spaced apart from each of the plurality of lower electrodes, a dielectric layer arranged between the lower electrodes and the upper electrode, and a plurality of first particles in contact with the dielectric layer and the upper electrode, and arranged between the dielectric layer and the upper electrode.

2. The semiconductor device of claim 1, wherein the capacitor structure further includes a plurality of second particles, and a plurality of third particles, the plurality of second particles are arranged between the dielectric layer and each of the plurality of lower electrodes, and the plurality of third particles are arranged between the dielectric layer and the upper electrode.

3. The semiconductor device of claim 2, wherein the upper electrode covers the dielectric layer, the plurality of first particles, and the plurality of third particles.

4. The semiconductor device of claim 2, wherein the supporters are in contact with each of the plurality of lower electrodes, and wherein the plurality of second particles are not arranged in an area in which the supporters and each of the plurality of lower electrodes are in contact.

5. The semiconductor device of claim 1, wherein the supporters comprise a first supporter and a second supporter, wherein the first supporter is arranged between the second supporter and the substrate, and wherein the second supporter is arranged on the first supporter and faces the first supporter.

6. The semiconductor device of claim 2, wherein the plurality of first particles, the plurality of second particles, and the plurality of third particles comprise at least one material from among TaO, TaAlO, TaON, AlO, AlSiO, HfO, HfSiO, ZrO, ZrSiO, TiO, and TiAlO.

7. The semiconductor device of claim 2, wherein the plurality of first particles, the plurality of second particles, and the plurality of third particles are covalently bonded to the surface of the dielectric layer.

8. The semiconductor device of claim 2, wherein the plurality of first particles, the plurality of second particles, and the plurality of third particles have a size in a range of about 1 nm to about 5 nm.

9. The semiconductor device of claim 2, wherein the plurality of first particles, the plurality of second particles, and the plurality of third particles have any one of a spherical shape and a hemispherical shape.

10. The semiconductor device of claim 1, wherein each of the plurality of lower electrodes comprises at least one of Ti, Ta, W, and Ru.

11. A semiconductor device comprising:

a substrate; and a capacitor structure arranged on the substrate, wherein the capacitor structure includes a plurality of lower electrodes extending in a vertical direction perpendicular to a surface of the substrate and spaced apart from each other, supporters arranged between the plurality of lower electrodes, an upper electrode spaced apart from each of the plurality of lower electrodes, a dielectric layer arranged between each of the plurality of lower electrodes and the upper electrode, and a plurality of particles in contact with the dielectric layer and arranged between each of the plurality of lower electrodes and the upper electrode, wherein the plurality of particles comprise first particles and second particles, the first particles are arranged between the dielectric layer and each of the plurality of lower electrodes, and the second particles are arranged between the dielectric layer and the upper electrode.

12. The semiconductor device of claim 11, wherein a part of the first particles is in contact with each of the plurality of lower electrodes, and another part of the first particles is in contact with the dielectric layer, and wherein a part of the second particles is in contact with the upper electrode, and another part of the second particles is in contact with the dielectric layer.

13. The semiconductor device of claim 11, wherein the first particles are arranged along a part of the inner sidewall of each of the plurality of lower electrodes but not on another part of the inner sidewall of each of the plurality of lower electrodes being in contact with the supporters.

14. The semiconductor device of claim 11, wherein the first particles and the second particles include the same material, and wherein the second particles are arranged to be spaced apart from the first particles with the dielectric layer therebetween.

15. The semiconductor device of claim 11, wherein the plurality of particles further comprise third particles, and the third particles are arranged on the dielectric layer along a direction of the supporters that intersects the vertical direction.

16. The semiconductor device of claim 11, wherein the supporters are in contact with each of the plurality of lower electrodes, and wherein the first particles and the second particles are not arranged on the same level in the vertical direction as the supporters.

17. The semiconductor device of claim 11, wherein the first particles and the second particles have any one of a spherical shape and a hemispherical shape, and wherein the first particles and the second particles have a size in a range of about 1 nm to about 5 nm.

18. A semiconductor device comprising:

a substrate; and a capacitor structure arranged on the substrate, wherein the capacitor structure includes a plurality of lower electrodes extending in a vertical direction perpendicular to a surface of the substrate and spaced apart from each other;

supporters arranged between the plurality of lower electrodes;

an upper electrode spaced apart from each of the plurality of lower electrodes;

a dielectric layer arranged between the lower electrodes and the upper electrode; and a plurality of particles each in contact with the dielectric layer and arranged between each of the plurality of lower electrodes and the upper electrode, wherein:

the plurality of particles comprise first particles, second particles, and third particles, the first particles are arranged between the dielectric layer and each of the plurality of lower electrodes, and the second particles and the third particles are arranged between the dielectric layer and the upper electrode, and wherein:

the supporters comprise a first supporter and a second supporter, the first supporter is arranged between the second supporter and the substrate, the second supporter is arranged on the first supporter, facing the first supporter, and each of the plurality of lower electrodes comprises at least one of Ti, Ta, W, and Ru.

19. The semiconductor device of claim 18, wherein the first particles, the second particles, and the third particles include the same material, wherein the first particles are arranged along a part of the inner sidewall of each of the plurality of lower electrodes but not on another part of the inner sidewall of each of the plurality of lower electrodes being in contact with the supporters, and wherein the second particles are spaced apart from the first particles with the dielectric layer therebetween, and the third particles are arranged on the dielectric layer along a direction of the supporters that intersects the vertical direction.

20. The semiconductor device of claim 18, wherein the first particles, the second particles, and the third particles have a size in a range of about 1 nm to about 5 nm, and wherein the first particles, the second particles, and the third particles are covalently bonded to the surface of the dielectric layer.

* * * * *